(12) United States Patent
Brese et al.

(10) Patent No.: US 6,811,761 B2
(45) Date of Patent: Nov. 2, 2004

(54) SILICON CARBIDE WITH HIGH THERMAL CONDUCTIVITY

(75) Inventors: Nathaniel E. Brese, Lansdale, PA (US); Jitendra S. Goela, Andover, MA (US); Michael A. Pickering, Dracut, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 273 days.

(21) Appl. No.: 10/035,877

(22) Filed: Nov. 9, 2001

(65) Prior Publication Data

US 2002/0106535 A1 Aug. 8, 2002

Related U.S. Application Data

(60) Provisional application No. 60/247,267, filed on Nov. 10, 2000.

(51) Int. Cl.$^7$ ............................................. C01B 31/36
(52) U.S. Cl. ........................................ 423/345; 423/346
(58) Field of Search ................................. 423/345, 346

(56) References Cited

U.S. PATENT DOCUMENTS

| | | | |
|---|---|---|---|
| 5,354,580 A | | 10/1994 | Goela et al. |
| 5,374,412 A | | 12/1994 | Pickering et al. |
| 5,612,132 A | | 3/1997 | Goela et al. |
| 5,618,594 A | | 4/1997 | Tulloch et al. |
| 6,077,619 A | * | 6/2000 | Sullivan ................ 428/698 |
| 2002/0004444 A1 | * | 1/2002 | Goela et al. ................ 501/88 |

FOREIGN PATENT DOCUMENTS

| | | |
|---|---|---|
| EP | 0 307 292 | 3/1989 |
| EP | 0 588 479 A1 | 3/1994 |
| EP | 0 955 278 A2 | 11/1999 |
| EP | 0 987 231 A | 3/2000 |
| EP | 1 018 567 A | 7/2000 |

OTHER PUBLICATIONS

Collins et al., "Grain Size Dependence of the Thermal Conductivity of Polycrystalline Chemical Vapor Deposited β–SiC at Low Temperatures", J. Appl. Phys. 68 (12), Dec. 15, 1990, pp. 6510–6512.

Papasouliotis et al., "Hydrogen Chloride Effects on the CVD of Silicon Carbide from Methyltrichlorosilane", Chem. Vap. Deposition 1998, 4, No. 6, pp. 235–246.

Tateyama et al., "Prediction of Stacking Faults in β–Silicon Carbide: X–ray and NMR Studies", Chem. Mater. 1997, 9, pp. 776–772.

Geril et al., "Thin Shell Replication of Grazing Incidence (Wolter Type I) SiC Mirrors", Proceedings of the SPIE, SPIE, Bellingham, VA, US, vol. 2478, Apr. 18, 1995 pp. 215–227 XP002119139, p. 217.

* cited by examiner

*Primary Examiner*—Stanley S. Silverman
*Assistant Examiner*—Edward M. Johnson
(74) *Attorney, Agent, or Firm*—John J. Piskorski

(57) ABSTRACT

A chemical vapor deposited, β phase polycrystalline silicon carbide having a high thermal conductivity and reduced stacking faults. The silicon carbide is synthesized under specific conditions using hydrogen gas and methyltrichlorosilane gas as reactants. The thermal conductivity of the silicon carbide is sufficiently high such that it can be employed as parts of apparatus and components of electrical devices where a high heat load is generated. Such components may include active thermoelectric coolers, heat sinks and fans.

16 Claims, 3 Drawing Sheets

SILICON CARBIDE WITH HIGH THERMAL CONDUCTIVITY

This application claims the benefit of U.S. Provisional Application Ser. No. 60/247,267, filed Nov. 10, 2000.

BACKGROUND OF THE INVENTION

The present invention is directed to an improved chemical vapor deposited (CVD) silicon carbide (SiC). More specifically, the present invention is directed to a chemical vapor deposited (CVD) silicon carbide (SiC) with reduced stacking faults and high thermal conductivity.

Many manufacturing steps are involved in the production of semiconductor devices. Some steps in the manufacture of semiconductor devices involve rapid thermal processing where heat is necessarily applied and dissipated rapidly from the wafer and wafer holders in the processing of semiconductors. If materials that comprise the wafer and wafer holders have an insufficiently high thermal conductivity, the materials may fail, i.e., crack or fracture due to thermal stress. Additionally, there is a need to manage heat generation and flow in electronic devices. For example, active thermoelectric coolers as well as heat sinks and fans have become ubiquitous in electronic devices such as microprocessors. Electronic devices that contain such "chillers" need to have high thermal conductivities. During operation, many electronic devices generate high amounts of heat. Without suitable thermoelectric coolers, heat sinks, or fans, the electronic devices can not dissipate heat fast enough and they degenerate or break down. Thus such electronic devices would have short life spans, and would be inefficient for industries employing the devices. Accordingly, it is imperative that such electronic devices have heat sinks composed of high thermal conductivity materials to dissipate generated heat.

SiC has been found to be very useful as a material in semiconductor processing equipment and components of electronic devices because of the high theoretical thermal conductivity of SiC crystals. Other inherent properties of SiC that are desirable for such equipment and components are high specific stiffness, strength, hardness, low thermal expansion, chemical and oxidation resistance, and thermal shock resistance. Although SiC has been used in apparatus and electronic devices successfully, there is still a need for a SiC having improved properties. As the computer industry realizes smaller and more advanced semiconductor devices there is a need for more rapid heating and cooling during device fabrication and more surface heating of the wafer during those operations. Thus, apparatus used to make the semiconductors preferably are made of materials that can dissipate heat rapidly. Also, as the speed and memory of electronic devices increases more heat is generated during operation, thus the thermal conductivity of component parts in such devices must increase.

The highest theoretical thermal conductivity for single crystal SiC has been estimated to be about 490 W/mK. However, single crystal SiC is difficult to produce in large enough sizes to employ in the manufacture of such materials as semiconductor furnace support components, and is considerably more expensive than polycrystalline SiC. Unfortunately, polycrystalline SiC does not achieve the theoretical thermal conductivity of a single crystal of SiC due to the presence of grain boundaries, which scatter phonons or sound energy. Accordingly, it is very difficult to predict a range, let alone a specific value, for the thermal conductivity of a chemical vapor deposited, polycrystalline SiC. In addition, point, line and extended defects diminish the thermal conductivity of polycrystalline SiC. Such defects add to the difficulty of preparing a SiC with a desired high thermal conductivity. Another crystalline problem associated with polycrystalline SiC that may effect the thermal conductivity are stacking faults as suggested in W. Kowbel et al. "Effects of Boron Doping on the Thermal Conductivity of Chemical Vapor Infiltration (CVI) SiC", *Journal of Material Synthetic Processes*, 4 (1996) pg. 195–204. Kowbel et al. employ both boron doping and annealing at a temperature of 1500° C. to reduce the stacking faults in fiber-reinforced SiC composites (SiC/SiC). Kowbel et al. states that the reduction in the stacking faults improved thermal conductivity of the fiber-reinforced SiC. However, Kowbel et al. only achieved a maximum thermal conductivity of 140 W/mK. Such low thermal conductivities are unsuitable for the demands of the semiconductor device and electronic device industries.

Stacking faults are gaps or separations in the continuity of the crystalline lattice of polycrystalline SiC. If such gaps in the crystalline lattice reduce the capacity of the SiC to conduct and dissipate heat, a "chiller", such as a heat sink, composed of such material is not reliable in an electronic device where a high heat load is continuously generated. Such reliability of a heat sink to conduct, and dissipate large amounts of heat is becoming more and more important as improved electronic devices are generating very high amounts of energy during operation. Some electronic devices may generate heat load values in excess of 300 Kcals/min. Such high heat generation can readily damage electronic devices after about 200 hours of operation without an appropriate heat sink. Preferably, heat sinks in such devices are composed of materials such as SiC having thermal conductivities of at least 300 W/mK. Most preferably, the thermal conductivity of SiC is at least 375 W/mK. However, with the exceptions discussed below, few if any methods have been developed to provide a SiC with a thermal conductivity that exceeds 300 W/mK, let alone 375 W/mK. Further, improved apparatus employed in manufacturing semiconductors are also generating very high quantities of heat, and require component parts having high thermal conductivities. Accordingly, there is still a need to develop an improved SiC with a thermal conductivity such that the SiC can be employed in apparatus and electrical devices that generate very high heat loads.

Silicon carbide is deposited by CVD from a gaseous mixture of methyltrichlorosilane (MTS), $H_2$, and an inert or non-reactive gas such as argon, helium or nitrogen, argon being preferred. Freestanding SiC is pyrolitically deposited on a mandrel, such as a graphite mandrel, from which it is removable. The MTS is the preferred source of both the silicon and carbon and provides these reactants in stoichiometric (1:1) ratios. The $H_2$ scavenges chlorine to produce hydrochloric acid. The inert or non-reactive gas acts as a carrier gas for MTS (which is liquid at ambient temperatures); and can be varied to adjust velocity of gas flow through the furnace as is necessary to sweep reaction product, such as hydrochloric acid, from the deposited SiC. The inert or non-reactive gas also acts as a diluent, preventing gas-phase reactions that may introduce impurities into the SiC. CVD production of free-standing SiC material are described in U.S. Pat. Nos. 4,990,374; 4,997,678; and 5,071,596, the teachings of these patents being incorporated in their entirety herein by reference. However, the methods described in the foregoing patents did not achieve a SiC with a thermal conductivity of greater than 300 W/mK. Further experimentation was necessary to find a method for obtaining a SiC with a thermal conductivity of 300 W/mK.

U.S. Pat. No. 5,374,412, to Pickering et al. and assigned to CVD, Inc., discloses an impinging flow method to make a polycrystalline SiC with a high thermal conductivity. The thermal conductivity of SiC prepared by the method disclosed in the patent is at least about 300 W/mK. The patent records a thermal conductivity of 304.9 W/mK at 28° C. The SiC is deposited using reactants methyltrichlorsilane (MTS), and $H_2$ gas in an inert carrier gas environment. The conditions included: a deposition chamber pressure of between about 180 and 220 torr, a deposition chamber temperature of between about 1340° C. and 1380° C., a deposition rate of between about 1.0 and about 2.0 $\mu$m/min., and an $H_2$/MTS gas partial pressure flow ratio of between about 4 and about 10. Further, $H_2$ supplied as a part of the gas stream, is purified such that $H_2$ contains less than about 1 ppm of $O_2$ gas, and various means are provided to exclude particulate contaminant material from the deposition chamber.

The SiC is fabricated by the aforementioned process on a mandrel that is placed perpendicular to the flow, i.e., an impinging flow configuration, of the reactants. The high thermal conductivity SiC is machined to its end-use configuration, e.g., a hard disc or a read/write head, and highly polished on an appropriate surface or surfaces. The very specific set of deposition parameters set forth above achieve the combination of a high polishabilty and high thermal conductivity SiC.

The '412 patent discloses that thermal conductivity of SiC is dependent on the grain size and purity of the SiC material, i.e., the thermal conductivity increases with increasing grain size and low impurity concentration along the grain boundaries. The grain size, and therefore, the thermal conductivity, is controlled by deposition chamber temperature, pressure and reactant gas flow rates. For example, under conditions of high temperature and low MTS flow rates (which results in low MTS partial pressure), the grain size increases. As the deposition temperature is lowered and the MTS flow increases, the grain size decreases. Thus, altering the aforementioned parameters in CVD of SiC are known to increase the thermal conductivity of SiC. However, because of the crystalline defects in polycrystalline SiC discussed above, altering one or more of the aforementioned parameters does not provide a reliable means of obtaining a SiC having a specific thermal conductivity. For example, decreasing the reactant gas flow rate by half does not increase the thermal conductivity of vapor deposited SiC to a predictable value. The thermal conductivity may increase a few units or only a fraction of a unit. Similar results are true when altering the other parameters described above.

U.S. Pat. No. 5,354,580, to Goela et al. and assigned to CVD Inc. discloses an apparatus and method for CVD deposition of SiC by a parallel deposition process. In the parallel process, the reactant flow is parallel to the mandrel on which the SiC deposits. A deposition chamber in which the flow is parallel to the deposition surface or mandrel provides good potential to obtain high deposition efficiency, and a product of high quality. The SiC produced by the specific process disclosed in the patent had a thermal conductivity of 315 W/mK and a good polishability. The SiC was generated at the following specific conditions: a furnace temperature of 1350° C., a furnace pressure of 200 torr, an argon flow rate of 13 slpm (standard liters per minute measured at atmospheric pressure and 20° C.), $H_2$ flow rate of 22 slpm, and an MTS flow rate of 5.1 slpm. The deposition was performed for 76 hours.

The aforementioned methods have produced polycrystalline silicon carbide having improved thermal conductivities. However, since there is a continuously increasing demand for SiC having very high thermal conductivities, there is a need for a SiC and a method of making the same that has a thermal conductivity of at least 375 W/mK.

SUMMARY OF THE INVENTION

The present invention is directed to a freestanding polycrystalline silicon carbide (SiC) produced by chemical vapor deposition (CVD). The SiC of the present invention has reduced stacking faults, and a thermal conductivity of at least 375 W/mK, a property that is advantageous in dissipating heat. The SiC can be employed in high heat load apparatus where semiconductors are manufactured without concern that the SiC may degenerate. The SiC also is employed in active thermoplastic coolers as well as heat sinks and fans in electronic devices where high heat is generated.

The SiC is deposited on a suitable mandrel by parallel flow in a chemical vapor deposition chamber at specific deposition conditions. In parallel flow deposition, the reactant gases in the deposition chamber flow parallel to the surface of the mandrel on which SiC is deposited. SiC having thermal conductivities of at least 375 W/mK are obtained from the mandrel at between about 50 cm to about 140 cm from the source of the gas reactants.

Reactants employed to chemically vapor deposit SiC are methyltrichlorosilane (MTS), $H_2$ gas and an inert carrier gas. The conditions include a deposition chamber pressure of about 100 to about 300 torr; a deposition chamber temperature of greater than 1350° C. to about 1450° C.; a deposition rate of from about 1.0 $\mu$m/min. to about 3.0 $\mu$m/min.; and an $H_2$/MTS gas partial pressure ratio of between about 4 to about 10.

Advantageously, the SiC of the present invention has a high thermal conductivity such that the SiC can readily be employed as components of apparatus that make semiconductors where high heat loads are generated. Such heat loads may exceed 300 Kcal/min. Also, the SiC can be employed in active thermocoolers, heat sinks and fans in high heat generating electronic devices.

An objective of the present invention is to provide a chemical vapor deposited, silicon carbide with a thermal conductivity of at least 375 W/mK.

Another objective of the present invention is to provide a chemical vapor deposited, silicon carbide with reduced stacking faults.

An additional objective of the present invention is to provide for a chemical vapor deposited, silicon carbide that can be employed as component parts in apparatus used to manufacture semiconductors where high heat loads are generated.

A further objective of the present invention is to provide for a chemical vapor deposited, silicon carbide that can be employed as components of active thermoelectric coolers, heat sinks and fans in electronic devices that generate high heat radiation. Other objectives and advantages will be apparent to those of skill in the art after reading the following description of the invention and the appended claims.

DETAILED DESCRIPTION OF THE INVENTION

Figure 1:
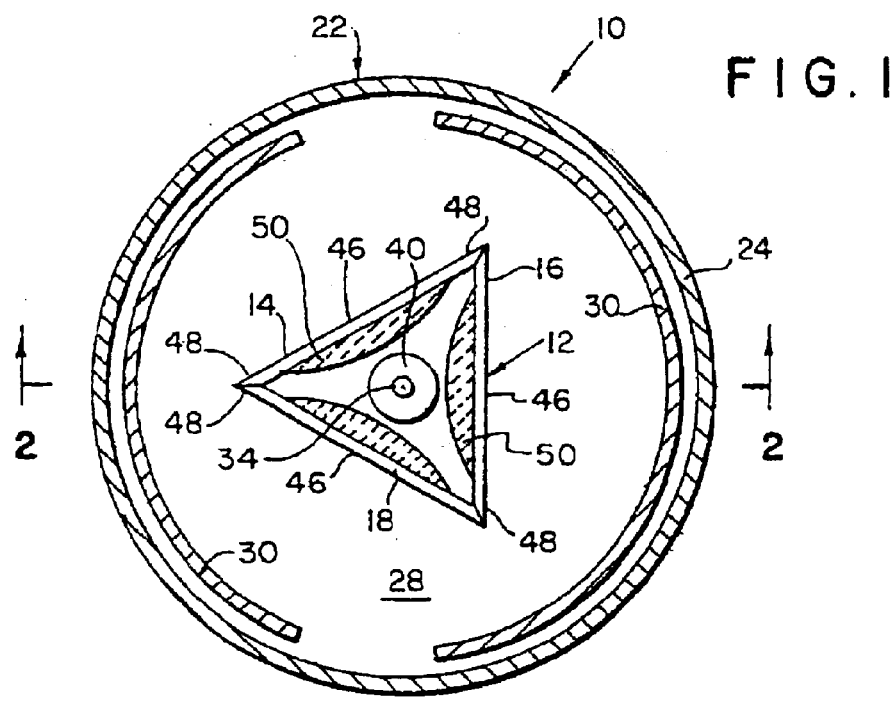
FIG. 1 is a top-plan view of a chemical vapor deposited furnace illustrating the arrangement of a single chemical vapor deposition cell of the present invention in the furnace.

The present invention is directed to a freestanding, chemical vapor deposited, β phase polycrystalline silicon carbide (SiC) having reduced stacking faults and other reduced crystalline defects such as point defects. The SiC has a crystalline irregularity as measured by X-ray diffraction of less than about 0.10. The β polycrystalline silicon carbide of the present invention also has a thermal conductivity of at least 375 W/mK. As the number of stacking faults decreases in the SiC the thermal conductivity increases.

Stacking faults may be monitored by X-ray diffraction methods well known in the art. X-ray diffraction patterns collected from cubic β polycrystalline SiC (lattice constant a=4.35 Å) have sharp diffraction Bragg peaks at the 2θ location in the polycrystalline SiC when using Cu Kα radiation: 35.8° {111} and 41.5° {200}. The numbers {111} and {200} are crystal orientation values. Stacking fault features are broader than standard Bragg diffraction and are several degrees in width near their Bragg counterparts. Thus by employing standard X-ray diffraction methods in the art, stacking faults in polycrystalline SiC can readily be distinguished from Bragg diffraction counterparts and measured. In order to measure stacking faults in chemical vapor deposited, silicon carbide, sum the total diffraction intensity from a 2θ value of 32° to 48° and subtract the baseline and the intensity attributable to the Bragg diffraction of 35.5° to 36° and 41.25° to 41.75°. The numerical value obtained is called the remaining intensity. The ratio of the remaining intensity to the total diffraction intensity is a gauge of the amount of irregularity in the crystalline order. The crystalline order ratio provides a measure of the stacking faults in the SiC. The higher the ratio the larger the number of stacking faults in the SiC. The lower the ratio the smaller the number of stacking faults in the SiC. The ratio for β polycrystalline SiC of the present invention is less than about 0.10, preferably, from about 0.05 to about 0.01.

Phonon mean free path of β phase polycrystalline SiC of the present invention ranges from about 50 to about 100 nanometers, preferably from about 75 nanometers to about 90 nanometers. The phonon mean free path is the average distance, measured in nanometers, traveled by phonons (sound energy) through a crystal lattice before experiencing a collision. Such collisions can occur with stacking faults, crystal grain boundaries or imperfections associated with any other defects in the SiC. Such phonon mean free paths provide for a means of dissipating energy from the crystal lattice. The phonon mean free path is comparable to the characteristic dimensions associated with stacking faults. Thus, reducing stacking faults in SiC increases the phonon mean free path, which increases the thermal conductivity of the SiC. Grain size in chemical vapor deposited SiC is in the range of from about 5 to about 20 microns. Although in general increasing the grain size increases the thermal conductivity in a polycrystalline material, in SiC the grain size is considerably larger than the phonon mean free path. Thus heat conduction is not expected to be affected by the SiC grain size. However, by controlling the stacking faults the phonon mean free path and hence the thermal conductivity can be controlled, and heat conduction can be improved.

Thermal conductivity in the SiC of the present invention may be described by the following equation:

$$K=Cvl/3$$

Where K is the thermal conductivity, C is the volumetric heat capacity, v is the carrier velocity and l is the mean free path that depends upon collisions of phonons that carry heat. The mean free path also has contributions from electrons, alloying elements, impurities, vacancies, crystal defects, elastic and optical discontinuities and the like. The crystal defects that affect the mean free path also include stacking faults as discussed above. Thus, by controlling the stacking faults of SiC the thermal conductivity also can be controlled.

Thermal conductivities of the present invention may range from at least 375 W/mK to about 390 W/mK. The β polycrystalline silicon carbide of the present invention is prepared under specific conditions in a chemical vapor deposition apparatus where the reactants flow parallel to the surface of the heated mandrel plates on which the SiC is deposited. The SiC of the present invention is prepared using methyltrichlorosilane (MTS), $H_2$ gas and an inert carrier gas. The inert carrier gas may include, but is not limited to, argon, neon, helium, xenon or a non-reactive gas such as $N_2$. Furthermore, $H_2$ supplied as part of the gas stream is purified such that the $H_2$ contains less than about 1 ppm $O_2$ gas. The deposition chamber temperature ranges from greater than 1350° C. to about 1450° C., preferably from about 1355° C. to about 1370° C. The furnace pressure ranges from about 10 torr to about 760 torr, preferably from about 150 torr to about 220 torr, and most preferably about 200 torr. The $H_2$/MTS gas partial pressure flow ratio ranges from about 4 to about 10, preferably from about 4 to about 7, and most preferably about 5 to about 6. Partial pressures of $H_2$ range from about 10 torr to about 120 torr, preferably, from about 60 torr to about 100 torr. Partial pressures of MTS range from about 2.5 torr to about 20 torr, preferably, from about 10 torr to about 15 torr. Partial pressures of the inert or non-reactive gas range from about 50 torr to about 190 torr, preferably, from about 80 torr to about 150 torr. Optionally, additional amounts of HCl gas may be generated into the deposition chamber to achieve a high thermal conductivity SiC. The partial pressures of HCl range from about 0.1 torr to about 10 torr, preferably, from about 1.0 torr to about 5.0 torr. The deposition rate in the deposition chamber for the reactants ranges from about 0.1 μm/min. to about 3.0 μm/min., preferably from about 0.8 μm/min to about 1.7 μm/min.

Gas flow rates for $H_2$ range from about 55 to about 75 slpm (standard liters per minute measured at atmospheric pressure and 20° C.). The MTS gas flow rate ranges from about 10 to about 15 slpm. The gas flow rate of the inert or non-reactive gas ranges from about 60 to about 140 slpm. Deposition time can vary, but often ranges from about 60 to about 250 hours, preferably from about 170 hours to about 200 hours.

Figure 2:
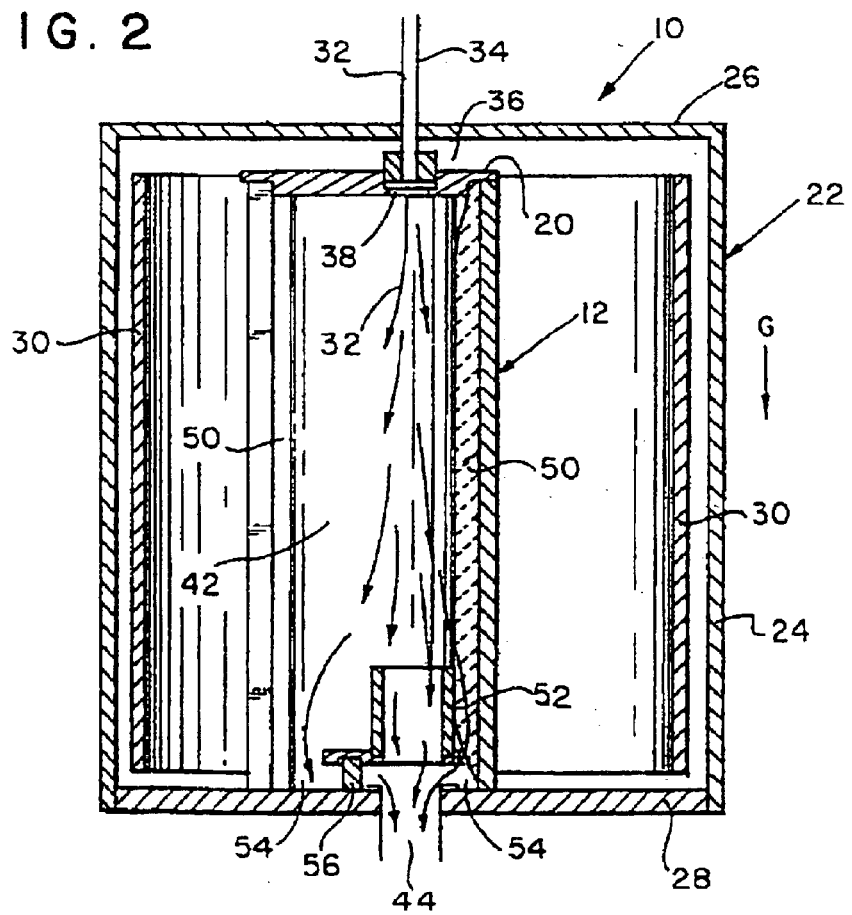
FIG. 2 is a cross-sectional view taken along line 2—2 of FIG. 1 illustrating the arrangement of a chemical vapor deposition furnace using the chemical vapor deposition cell to the present invention with gas flow in the same direction as the force of gravity.

Any suitable chemical vapor deposition chamber may be employed to practice the present invention as long as SiC can be deposited on a mandrel by means of parallel flow deposition with the specific conditions described above. A suitable chemical vapor deposition apparatus that may be employed to obtain SiC with a thermal conductivity of at least 375 W/mK is shown at 10 in FIGS. 1, 2, 3 and 4. The apparatus is composed of a triangular cell 12 with walls 14, 16, and 18, of about equal width and a length of about 3 to 4 times the width. The walls 14, 16, 18, support a chemical vapor deposition triangular cell cover plate 20. The triangular cell 12 is contained in a vacuum furnace 22 having an outer wall 24, a cover plate 26, and a base plate 28. Heating elements 30 are used to increase the temperature of the chemical vapor deposition furnace 22 and the walls 14, 16, and 18, of the triangular cell 12 to operating temperatures and maintain the vacuum furnace 22 and triangular cell 12 at operating temperatures during the chemical vapor deposition process. Referring to FIG. 2, a reaction gas 32, along with inert carrier gases pass through inlet tube 34 and are introduced from the top (inlet side) 36 of the vacuum furnace 22 through an injector 38 placed about in the center 40 of the triangular chamber cover plate 20, as shown in FIG. 1. The reaction gas 32 and carrier gases pass through the deposition zone 42 in the triangular cell 12 and unreacted gases exit through exhaust port 44.

As a consequence of the triangular shape, as shown in FIG. 1, the distance of the injector 38 from the center 46 of a wall (14, 16, and 18) to an edge 48 of a wall (14, 16, and 18) varies by a factor of two, for an equilateral triangle. This variation is beneficial in ensuring a tapering of the thickness of deposited material 50 from the centers 46 of a wall (14, 16, and 18) to the corresponding edges 48 of a wall (14, 16, and 18). The variation of the thickness of deposited material 50 from the center 46 to the edge 48 is most clearly illustrated in FIG. 1. Thus, thick deposited material 50 can be deposited in the center 46 of a wall and still the material at the edge 48 of the corresponding wall may be quite thin, thus permitting separation of the deposited material 50 without the use of a machining step. No other geometrical shape (i.e., square, pentagon and the like) provides such large ratio of the distance from a centrally located injector to the center 46 of the wall (14, 16, and 18) and from the injector 3 8 to the wall edge 48. Another advantage of the regular triangular geometry is that it provides the maximum ratio of the perimeter to the area of any known regular shape (i.e., square, circle, and the like). Consequently, the triangular cell 12 has a greater potential to provide higher reagent utilization efficiency for the same volume of the deposition zone.

Another advantage of the vertical cell 12 is that it provides for fewer inclusions in the product than an impinging flow configuration in which the mandrels are facing upward. With the apparatus of the present invention, the mandrel walls orientated vertically, any particulates that may fall from the injector due to gravity are swept to the exhaust region due to the force of gravity and the flow of the reaction gas. On the other hand, with the impinging flow configuration, the force of gravity and the flow of the reaction gas tends to push the particulates toward the mandrel where they are incorporated in the product as inclusions. Thus, the triangular deposition arrangement provides a product of equal or higher quality compared to a product produced by the impinging-flow arrangement.

A deposition tube 52 for the passage of reagents may be placed at the bottom (exhaust side) 54 of the triangular cell 12 on support 56. The reaction gas 32 can flow around the deposition tube 52, through it, or around it and underneath it, before exiting through the exhaust port 44 and into the exhaust gas treatment system (not shown). The deposition tube 52 can function as an additional deposition surface to form three-dimensional parts of chemically vapor deposited SiC.

Figure 3:
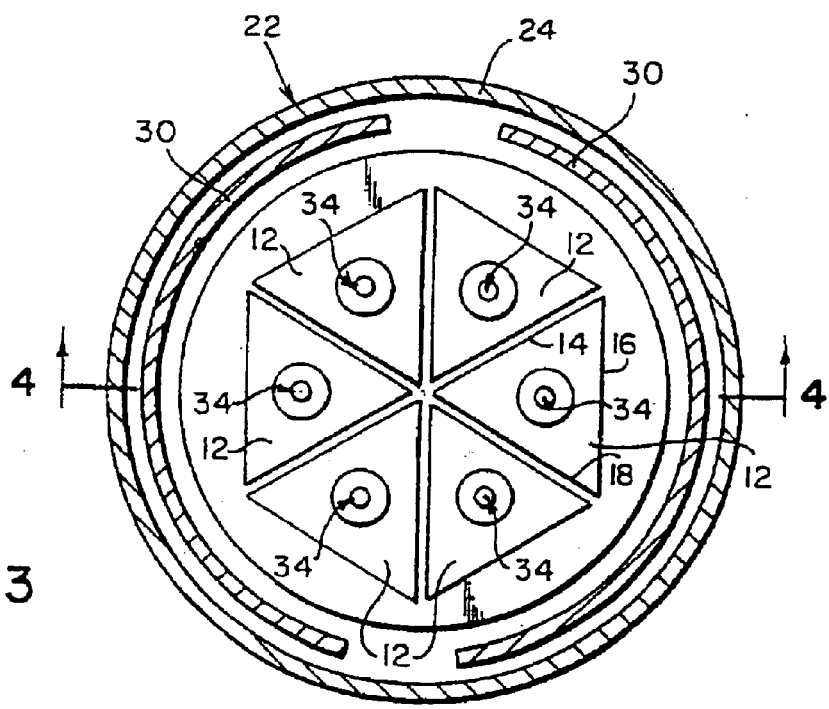
FIG. 3 is a top-plan view of a chemical vapor deposition furnace illustrating the arrangement of multiple chemical vapor deposition cells of the present invention within a furnace.
Figure 4:
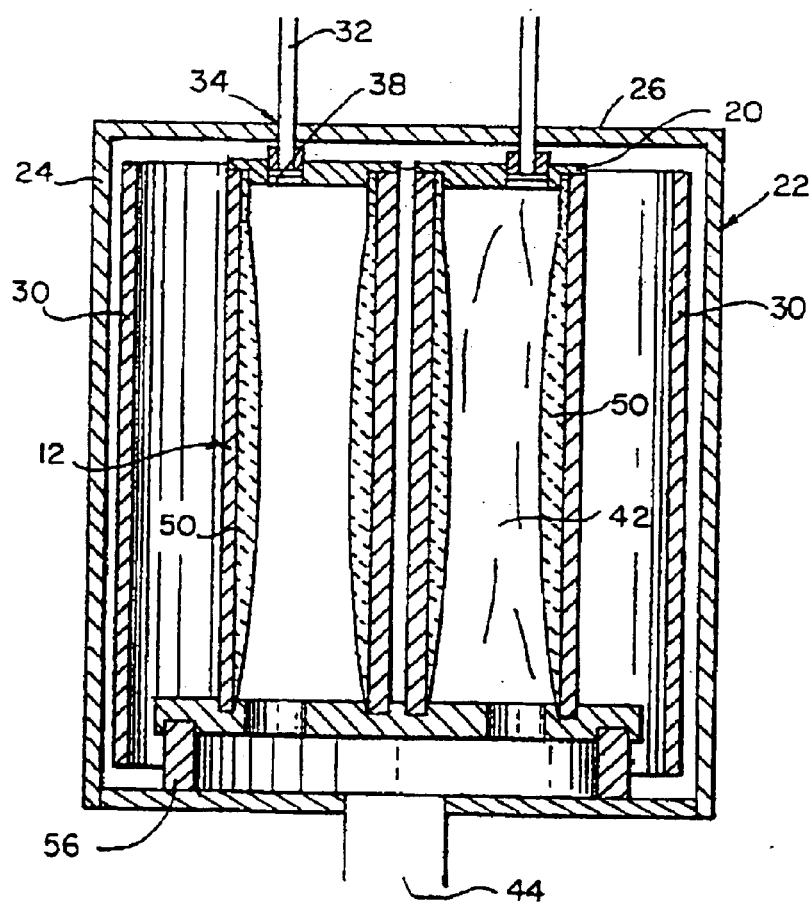
FIG. 4 is a cross-sectional view taken along line 4—4 of FIG. 3 illustrating the arrangement of multiple chemical vapor deposition cells of the present invention within a furnace.

The triangular deposition cell 12 is well suited for scaling. It is easy to close pack triangular deposition cells in a round furnace than square or cylindrical cells. FIGS. 3 and 4 show six triangular cells 12 that are arranged in the form of a hexagon. One injector is used in each triangular cell to supply reagents. The closed pack arrangement provides considerable surface area for deposition of material and is compact in design. For example, six triangles, each with sides 8-inches wide and length 27-inches long, provides a total deposition of about 3900 square inches but can be accommodated in a furnace of 25-inch diameter. To obtain the same deposition area in an impinging flow configuration, the furnace would require a diameter of 71 inches.

The walls 14, 16, and 18 can be made of any material that is comparable with the chemical vapor deposition process, such as graphite, but not limited to; silicon, silicon carbide, molybdenum, tungsten, or tantalum. Graphite is the preferred material because graphite is a high-temperature material compatible with the SiC process, and graphite is relatively cheap and easy to fabricate, and graphite has a thermal expansion (hereinafter referred to as CTE) closely matching that of SiC. The latter advantage minimizes stresses in SiC when the material is cooled from the deposition temperature to room temperature. The vacuum furnace 22 for use with the present invention can be any furnace suitable for use with chemical vapor deposition applications.

Figure 5:
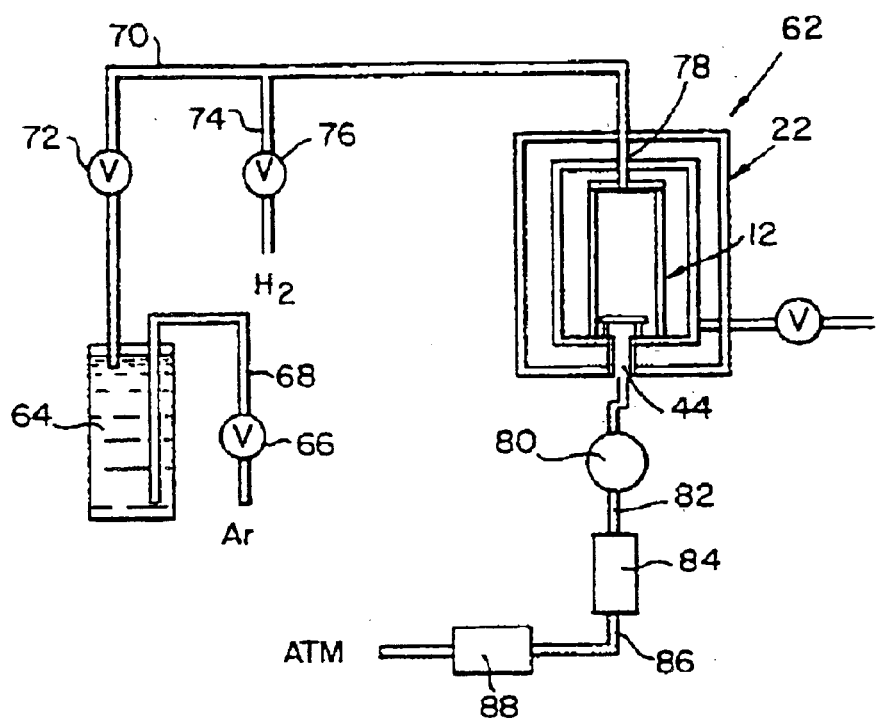
FIG. 5 is a schematic illustration of a chemical vapor deposition system in which the chemical vapor deposition cell of FIG. 2 and FIG. 4 may be incorporated.

FIG. 5 is a schematic illustration of a chemical vapor deposition system 62 that may be used with the triangular cell 12 of the invention. As seen in FIG. 5, inert gas enters a bubbler chamber 64 from a suitable source (not shown) by way of valve 66 and a flow line 68. Bubbler chamber 64 may contain MTS or trichlorosilane ($SiHCl_3$), hereinafter referred to as TS). MTS is preferred to produce a SiC deposit. TS is preferred to produce a Si deposit. As those skilled in the art understand, however, other hydrocarbon and silane sources can be used to produce SiC and Si deposits.

An inert gas, such as argon gas, bubbles carrying the reagent MTS or TS enter a flow line 70 under the control of a valve 72. Hydrogen enters the flow line 70 through a flow line 74 from a suitable source (not shown) under the control of a valve 76. The hydrogen gas may be purified. The reagents may be introduced into a triangular cell 12 of the chemical vapor deposition system 62 through injectors 78 that may be identical to the injectors 32 shown in FIG. 2. Material is deposited on walls 14, 16, and 18 of triangular cell 12. The triangular cell 12 as described in the aforementioned discussion may be heated to a temperature in the range of greater than 1350° C. to about 1450° C. by heating elements 30.

Gaseous products are removed from the triangular cell 12 through exhaust port 44, through filter 80, and through a flow line 82 to a vacuum pump 84, the gases are conveyed through a flow line to a scrubber 88. The scrubbed gases are then vented to the atmosphere.

The following examples are intended to further illustrate the present invention, but are not intended to limit the scope of the invention.

EXAMPLE 1

SiC was deposited in a triangular deposition setup consisting of six separate deposition boxes as shown in FIGS. 3 and 4. The size of each individual triangular deposition box used was optimized to produce high thermal conductivity SiC. The length of each box was about 78 inches and each side of the triangles was about 21 inches. The reagent flow was from top to bottom such that the reagent flow was parallel to the graphite mandrels. To produce CVD deposited SiC in accordance with the invention, temperature, pressure, $H_2$/MTS ratio and deposition rate preferably is within the ranges set forth below, regardless of specific furnace design.

The temperature of the deposition chambers was about 1355° C. The furnace pressure was about 200 torr. The gas flow rate for $H_2$ was about 67 slpm (standard liters per minute measured at atmosphere pressure and 20° C.), and the gas flow rate for MTS was about 11 slpm. Argon gas was employed as the carrier gas at a flow rate of about 69 slpm. The SiC deposition was performed for about 190 hours at a rate of about 1.5 µm/min.

The SiC deposition thickness varied in range of from about 1.02 cm to about 2.15 cm on the mandrels. The thinner deposits were obtained at the top and bottom areas of the mandrels, and the thicker deposits were obtained in the center of the mandrels. Six samples from the center regions of the triangular deposition chambers were prepared and measured for thermal conductivity. The samples were measured for their thermal conductivity in the growth direction by a laser flash technique well known in the art. In the laser technique employed, the laser beam was used to heat one face of the sample. A thermocouple was fixed to the backside of the sample to record increases in the temperature of the sample. The time it takes for the heat to travel through the sample is measured and used to calculate sample thermal diffusivity. This diffusivity is then multiplied by a known density and specific heat of the sample to yield thermal conductivity. The samples that were taken from the middle of the deposition chamber (about 50 cm to about 140 cm from the gas source) had the highest thermal conductivity. Of the samples taken from the middle of the deposition chamber, about 16.7% had thermal conductivities of about 389 W/mK. The remainder had thermal conductivities of 330 W/mK, 331 W/mK, 336 W/mK and 278 W/mK.

Although the yield of 389 W/mK SiC was only about 16.7% of the yield of high thermal conductivity SiC, the 16.7% yield was still a significant improvement for the SiC industry. High thermal conductivity β phase polycrystalline SiC is very difficult to make, especially SiC having high thermal conductivities of 375 W/mK and greater. The present invention has provided a break through for making high thermal conductivity SiC. A method has been developed that satisfies the industries need for a thermal conductivity SiC of at least 375 W/mK.

What is claimed is:

1. A method of preparing a β phase polycrystalline silicon carbide having a high thermal conductivity and low stacking faults comprising:
   a) placing at least one mandrel in a chemical vapor deposition chamber such that the at least one mandrel is orientated in the deposition chamber such that a flow of reactants in the deposition chamber is parallel to a surface of the at least one mandrel;
   b) generating the reactants into the deposition chamber as gases such that the reactants form silicon carbide in the deposition chamber;
   c) maintaining a deposition chamber temperature of greater than 1350° C. to about 1450° C.; and
   d) depositing the silicon carbide on the surface of the at least one mandrel at a rate of from about 0.1 µm/min. to about 3.0 µm/min. to form a silicon carbide having a thermal conductivity of at least about 375 W/mK.

2. The method of claim 1, wherein the silicon carbide is deposited on the surface of the at least one mandrel at a rate of about 1.5 µm/min.

3. The method of claim 1, wherein the reactants comprise hydrogen gas and methyltrichlorosilane.

4. The method of claim 3, wherein a flow rate of hydrogen gas is from about 55 to about 75 slpm, and a flow rate of methyltrichlorosilane is from about 10 to about 15 slpm.

5. The method of claim 3, wherein a hydrogen gas/methyltrichlorosilane gas partial pressure flow rate is from about 4 to about 10.

6. The method of claim 1, wherein the deposition chamber has a pressure of from about 100 to about 300 torr.

7. The method of claim 1, wherein the at least one mandrel has a temperature of from about 1355° C. to about 1370° C.

8. The method of claim 1, wherein the silicon carbide has a thermal conductivity of from about 375 W/mK to about 390 W/mK.

9. The method of claim 1, wherein a crystalline order ratio of the silicon carbide is less than about 0.10.

10. The method of claim 9, wherein the crystalline order ratio is from about 0.05 to about 0.01.

11. The method of claim 1, wherein the silicon carbide is deposited on the mandrel between about 50 cm and 140 cm from a gas reactant source in the deposition chamber.

12. A method of preparing a β phase polycrystalline silicon carbide having a high thermal conductivity and low stacking faults comprising:
   a) placing at least one mandrel in a chemical vapor deposition chamber such that gas reactants flow parallel to a surface of the at least one mandrel;
   b) generating gas reactants composed of hydrogen gas and methyltrichiorosilane gas in the deposition chamber, a flow rate of the hydrogen gas is about 67 slpm and a flow rate of the methyltrichiorosilane gas is about 11 slpm;
   c) maintaining the deposition chamber temperature of about 1355° C., and the deposition chamber pressure at about 200 torr throughout the deposition method; and
   d) depositing silicon carbide on the surface of the at least one mandrel at a deposition rate of about 0.5 µm/min., the silicon carbide having a thermal conductivity of at least about 375 W/mK and a crystalline order ratio of less than 0.10.

13. The method of claim 12, wherein a gas partial pressure flow ratio of hydrogen/methyltrichlorosilane is about 6.0.

14. The method of claim 12, wherein the silicon carbide is deposited on the surface of the at least one mandrel between 50 cm to about 140 cm from a gas reactant source in the deposition chamber.

15. The method of claim 12, wherein the silicon carbide has a thermal conductivity of from about 375 W/mK to about 390 W/mK.

16. The method of claim 12, wherein the silicon carbide has a crystalline order ratio is from about 0.05 to about 0.010.

* * * * *